(12) United States Patent
Pedrami et al.

(10) Patent No.: US 11,500,011 B2
(45) Date of Patent: Nov. 15, 2022

(54) PRINTED CIRCUIT BOARD ASSEMBLY FOR AIRCRAFT ENGINE, AND METHOD MONITORING SAME

(71) Applicant: PRATT & WHITNEY CANADA CORP., Longueuil (CA)

(72) Inventors: Reza Pedrami, Montreal (CA); Carmine Lisio, Laval (CA); Richard Kudrna, Carignan (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 260 days.

(21) Appl. No.: 16/862,685

(22) Filed: Apr. 30, 2020

(65) Prior Publication Data
US 2021/0341530 A1 Nov. 4, 2021

(51) Int. Cl.
*G01R 31/28* (2006.01)
*G01R 31/304* (2006.01)

(52) U.S. Cl.
CPC ....... *G01R 31/2812* (2013.01); *G01R 31/304* (2013.01)

(58) Field of Classification Search
CPC .. G01R 1/04; G01R 1/07328; G01R 31/2805; G01R 31/68; H05K 2201/09009
See application file for complete search history.

(56) References Cited

U.S. PATENT DOCUMENTS

| 7,648,847 | B2 | 1/2010 | Schnetker | |
|---|---|---|---|---|
| 10,386,404 | B2 | 8/2019 | Kwon et al. | |
| 2002/0101256 | A1 | 8/2002 | Brown et al. | |
| 2011/0204992 | A1* | 8/2011 | McIntyre | H01P 5/18 333/116 |
| 2014/0043918 | A1* | 2/2014 | Ellis | G11C 29/16 365/201 |
| 2016/0349307 | A1 | 12/2016 | Komatsu et al. | |

* cited by examiner

*Primary Examiner* — Tung X Nguyen
(74) *Attorney, Agent, or Firm* — Norton Rose Fulbright Canada LLP

(57) ABSTRACT

There is provided an aircraft engine printed circuit board assembly generally having a functional circuit contributing to the operation of an aircraft engine. The functional circuit has a first substrate portion, a first electronic component supported by the first substrate portion, and a first electrical conductor supported by the first substrate portion and leading to the first electronic component. The aircraft engine printed circuit board assembly generally has a monitoring circuit having a second substrate portion, a second electronic component supported by the second substrate portion, a second electrical conductor supported by the second substrate portion and leading to the second electronic component, the second electrical conductor having a shorter life expectancy than the first electrical conductor, and a detector monitoring an indicator of operativeness of the second electrical conductor, in which the first electrical conductor and the second electrical conductor are both exposed to the same environment.

20 Claims, 8 Drawing Sheets

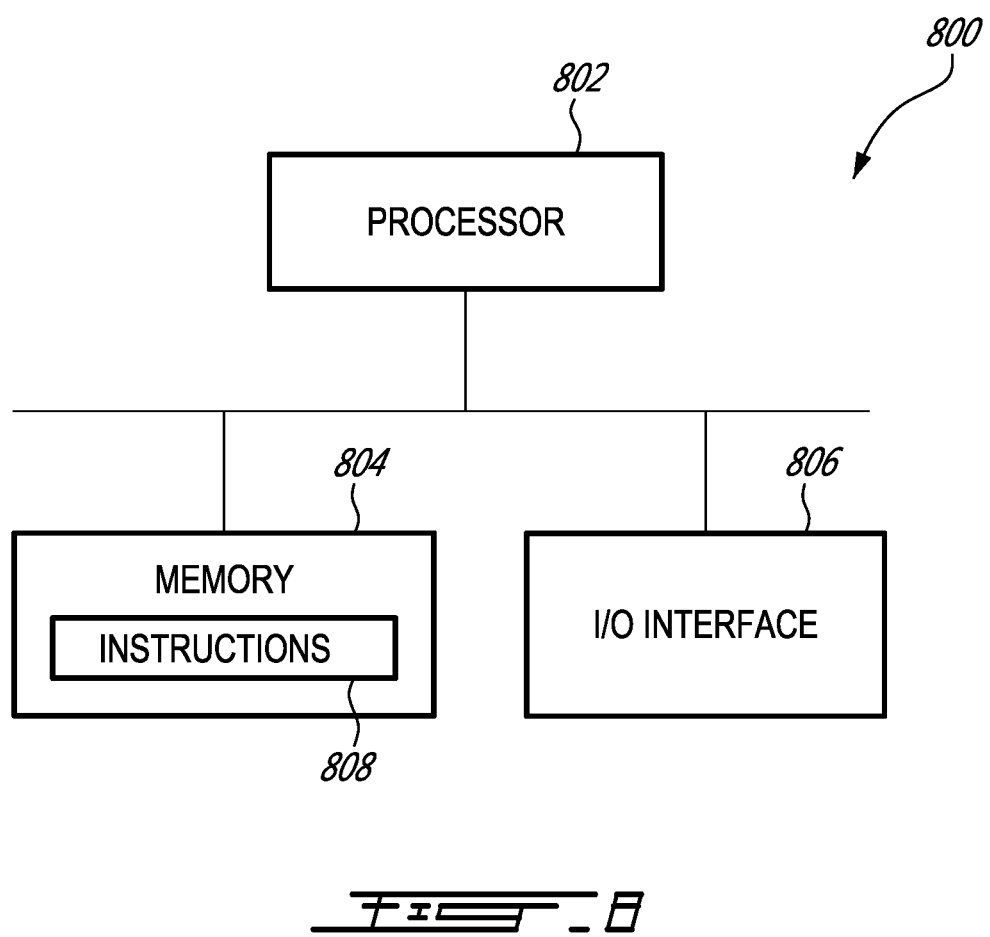

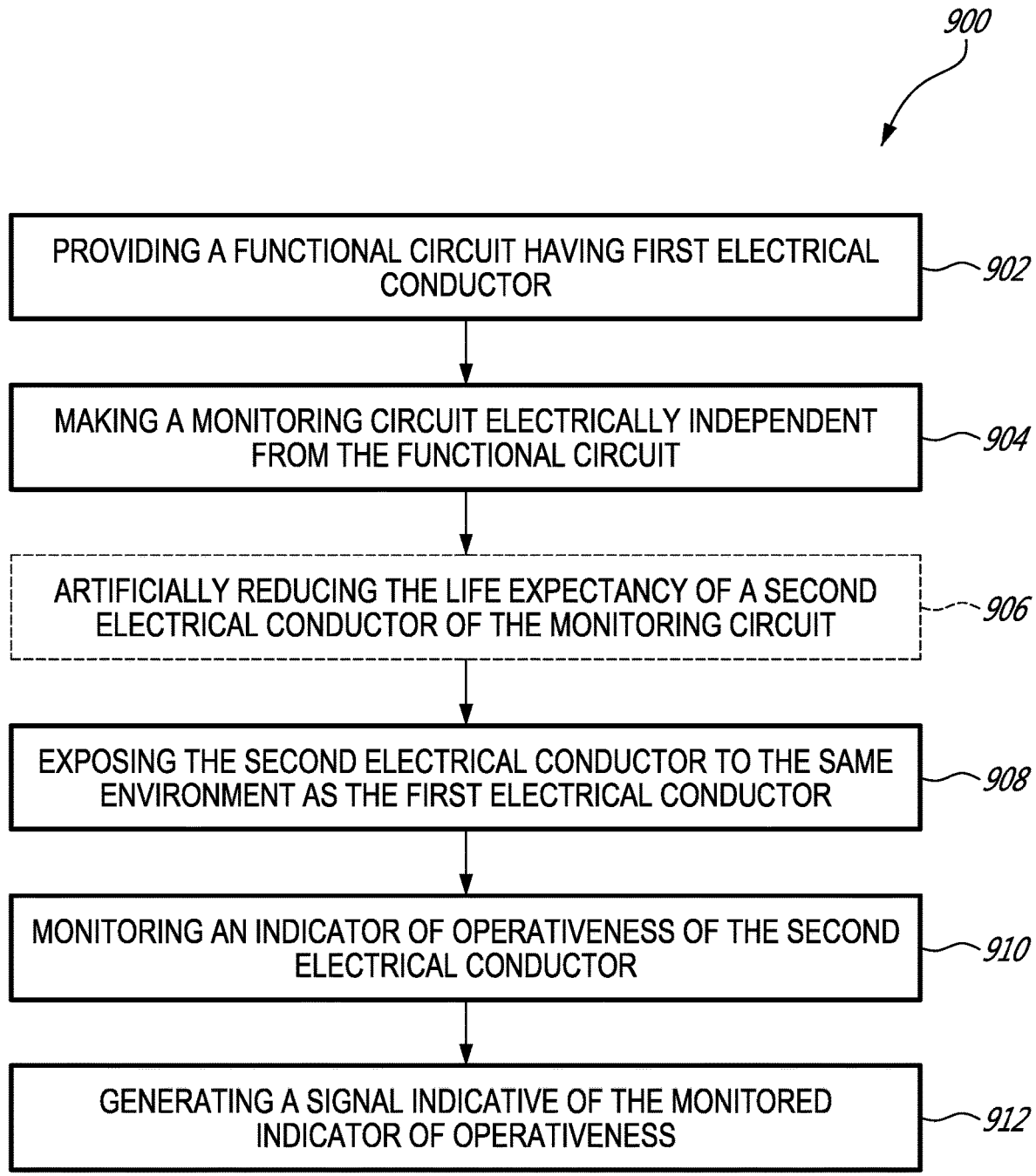

PRINTED CIRCUIT BOARD ASSEMBLY FOR AIRCRAFT ENGINE, AND METHOD MONITORING SAME

TECHNICAL FIELD

The application relates generally to printed circuit boards for aircraft engines and, more particularly, to the monitoring of such printed circuit boards.

BACKGROUND OF THE ART

The typical printed circuit board includes a substrate, conductive pads and traces laminated to the substrate, and electronic components interconnected to one another via the conductive pads and traces. Due to normal wear, including thermal expansion and contraction, it is known that the conductive pads and traces may damage, break and/or delaminate over time, eventually leading to malfunction of the circuit.

In some embodiments, such as aircraft engines for instance, it is desired to avoid scenarios of malfunction of circuits during operation. To this end, it was known to expose printed circuit boards to conditions similar to conditions of operation, and determine a life expectancy. Accordingly, replacement of the printed circuit boards can be scheduled in a manner to occur before expiration of the life expectancy. In practice, there is a limit in the accuracy achieved in determining life expectancy of printed circuit boards, and replacement or maintenance can be scheduled a significant amount of time before the expiration as an additional safety measure.

While known methods to address printed circuit board wear were satisfactory, there remained room for improvement. In particular, it can be desired to reduce the maintenance load on printed circuit boards while maintaining a satisfactory amount of security level.

SUMMARY

In one aspect, there is provided an aircraft engine printed circuit board assembly comprising: a functional circuit contributing to the operation of an aircraft engine, the functional circuit having a first substrate portion, a first electronic component supported by the first substrate portion, and a first electrical conductor supported by the first substrate portion and leading to the first electronic component; and a monitoring circuit having a second substrate portion, a second electronic component supported by the second substrate portion, a second electrical conductor supported by the second substrate portion and leading to the second electronic component, the second electrical conductor having a shorter life expectancy than the first electrical conductor, and a detector monitoring an indicator operativeness of the second electrical conductor; wherein the first electrical conductor and the second electrical conductor are both exposed to a same environment.

In another aspect, there is provided a method of monitoring a functional circuit contributing to the operation of an aircraft engine, the functional circuit having a first electrical conductor, the aircraft engine also having a monitoring circuit having a second electrical conductor with a shorter life expectancy than the first electrical conductor, the method comprising: exposing the second electrical conductor to the same environment as the first electrical conductor; monitoring an indicator of operativeness of the second electrical conductor; and generating a signal indicative of said monitored indicator of operativeness.

In a further aspect, there is provided a printed circuit board assembly comprising: a functional circuit having a first electronic component and a first electrical conductor leading to the first electronic component; and a monitoring circuit having a second electronic component and a second electrical conductor leading to the second electronic component, the second electrical conductor having a shorter life expectancy than the first electrical conductor, and a detector monitoring an indicator of operativeness of the second electrical conductor; wherein the first electrical conductor and the second electrical conductor are both exposed to the same environment.

DESCRIPTION OF THE DRAWINGS

Reference is now made to the accompanying figures in which:

FIG. 8 is a schematic view of an example of a computing device of the controller of FIG. 4; and FIG. 9 is a flow chart of a method of monitoring an aircraft engine printed circuit board assembly.

DETAILED DESCRIPTION

Figure 1:
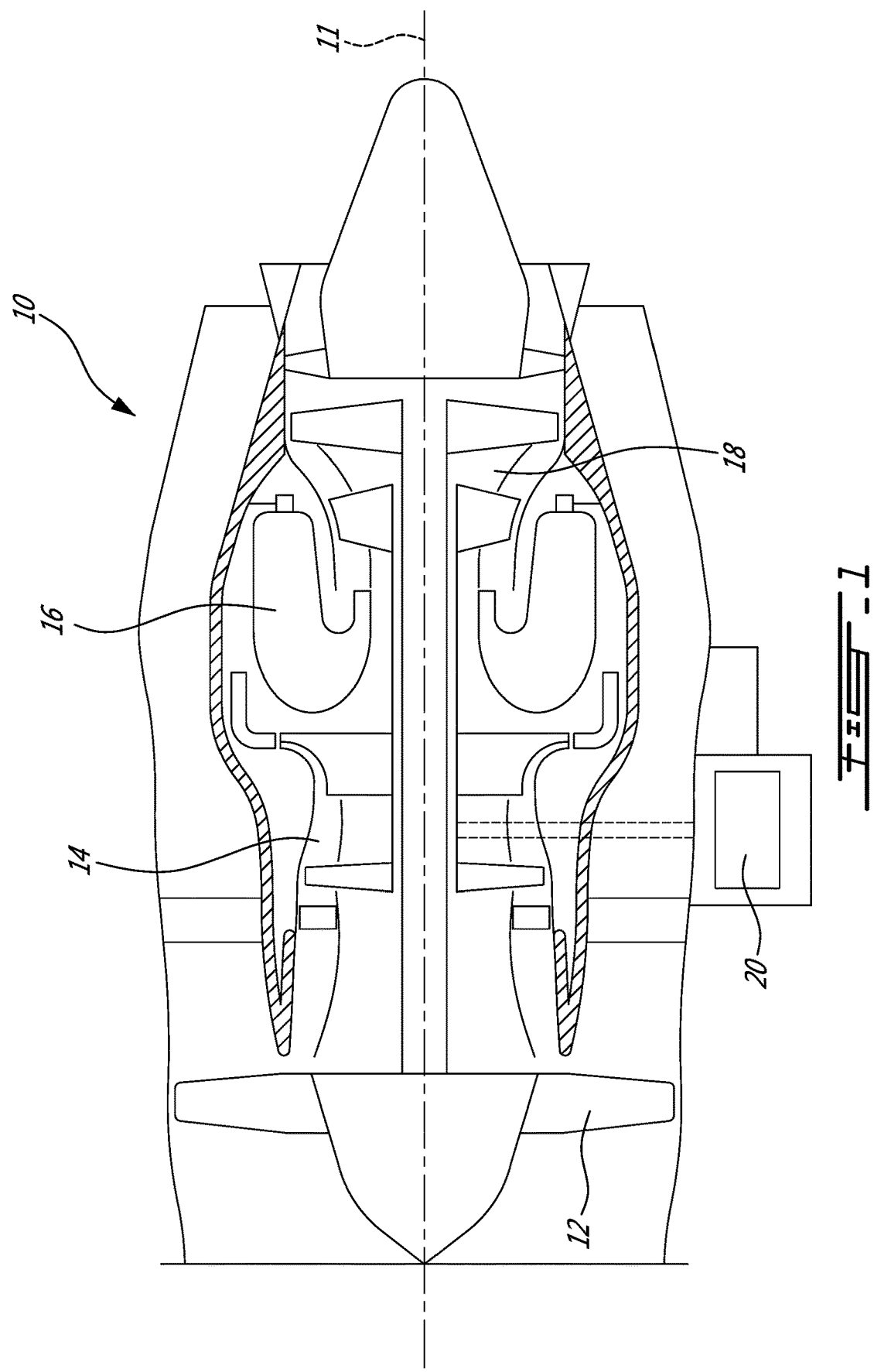
FIG. 1 is a schematic cross-sectional view of an example of an aircraft engine, shown with an aircraft engine printed circuit board assembly.

FIG. 1 illustrates an aircraft engine 10 of a gas turbine type preferably provided for use in subsonic flight. The depicted aircraft engine 10 generally comprises in serial flow communication a fan 12 through which ambient air is propelled, a compressor section 14 for pressurizing the air, a combustor 16 in which the compressed air is mixed with fuel and ignited for generating an annular stream of hot combustion gases, and a turbine section 18 for extracting energy from the combustion gases.

As shown, the aircraft engine 10 has a printed circuit board (PCB) assembly 20, referred to herein as "the aircraft engine PCB assembly 20." The aircraft engine PCB assembly 20 can be part of any engine controlling devices of the aircraft engine 10. For instance, the aircraft engine PCB assembly 20 can be part of an engine control unit (ECU), an engine electronic controller (EEC), an engine electronic control system (EECS), a Full Authority Digital Engine Controller (FADEC) or the like.

Figure 2:
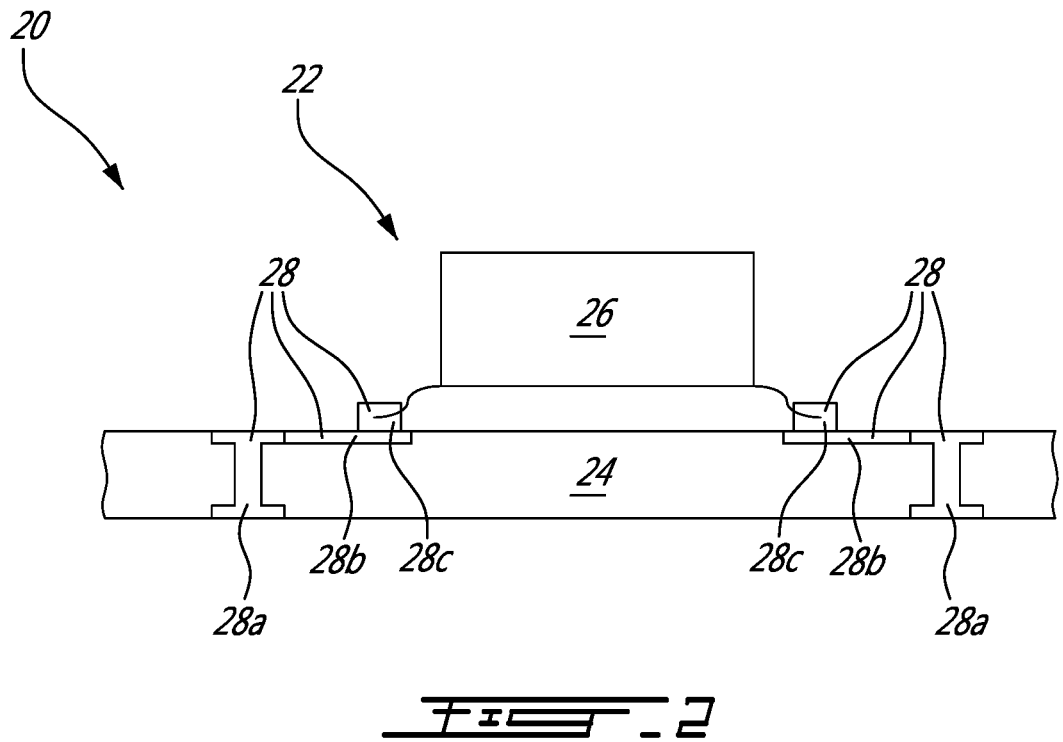
FIG. 2 is a schematic cross-sectional view of a functional circuit of the aircraft engine printed circuit board assembly of FIG. 1, showing a first substrate portion, a first electronic component, and a first electrical conductor.

Referring now to FIG. 2, the PCT assembly 20 has a functional circuit 22 which contributes to the operation of the aircraft engine 10. As such, the functional circuit 22 can have one or more functions within any engine controlling devices including, but not limited to, the ECU, the EECS and/or the FADEC referred to above.

As depicted, the functional circuit 20 has a first substrate portion 24, a first electronic component 26 supported by the first substrate portion 24, and a first electrical conductor 28 supported by the first substrate portion 24 and leading to the first electronic component 26. In this embodiment, the first electrical conductor 28 can include one or more of a via 28a (i.e., conductive hole), a conductive trace 28b and a solder joint 28c, to name some examples.

Figure 3:
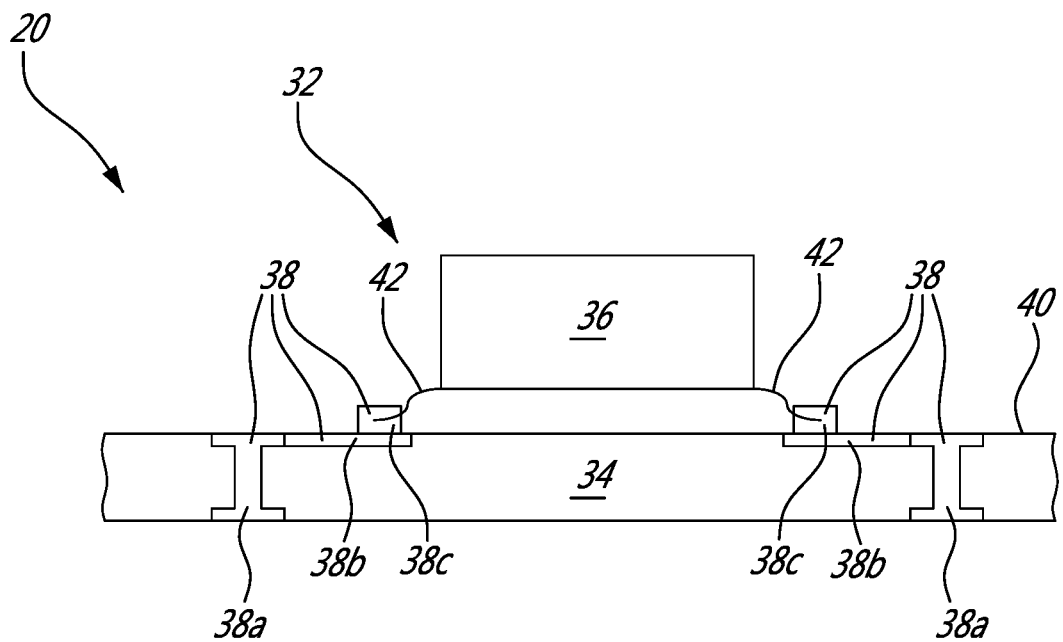
FIG. 3 is a schematic partial and cross-sectional view of a monitoring circuit of the aircraft engine printed circuit board assembly of FIG. 1, showing a second substrate portion, a second electronic component, and a second electrical conductor.

The PCT assembly 20 also has a monitoring circuit 32, a portion of which being shown in FIG. 3. As depicted, the monitoring circuit 32 has a second substrate portion 34, a second electronic component 36 supported by the second substrate portion 34, and a second electrical conductor 38 supported by the second substrate portion 34 and leading to the second electronic component 36. Similarly, in this embodiment, the second electrical conductor 38 can be provided in the form of a via 38a, a conductive trace 38b and/or a solder joint 38c.

Figure 4:
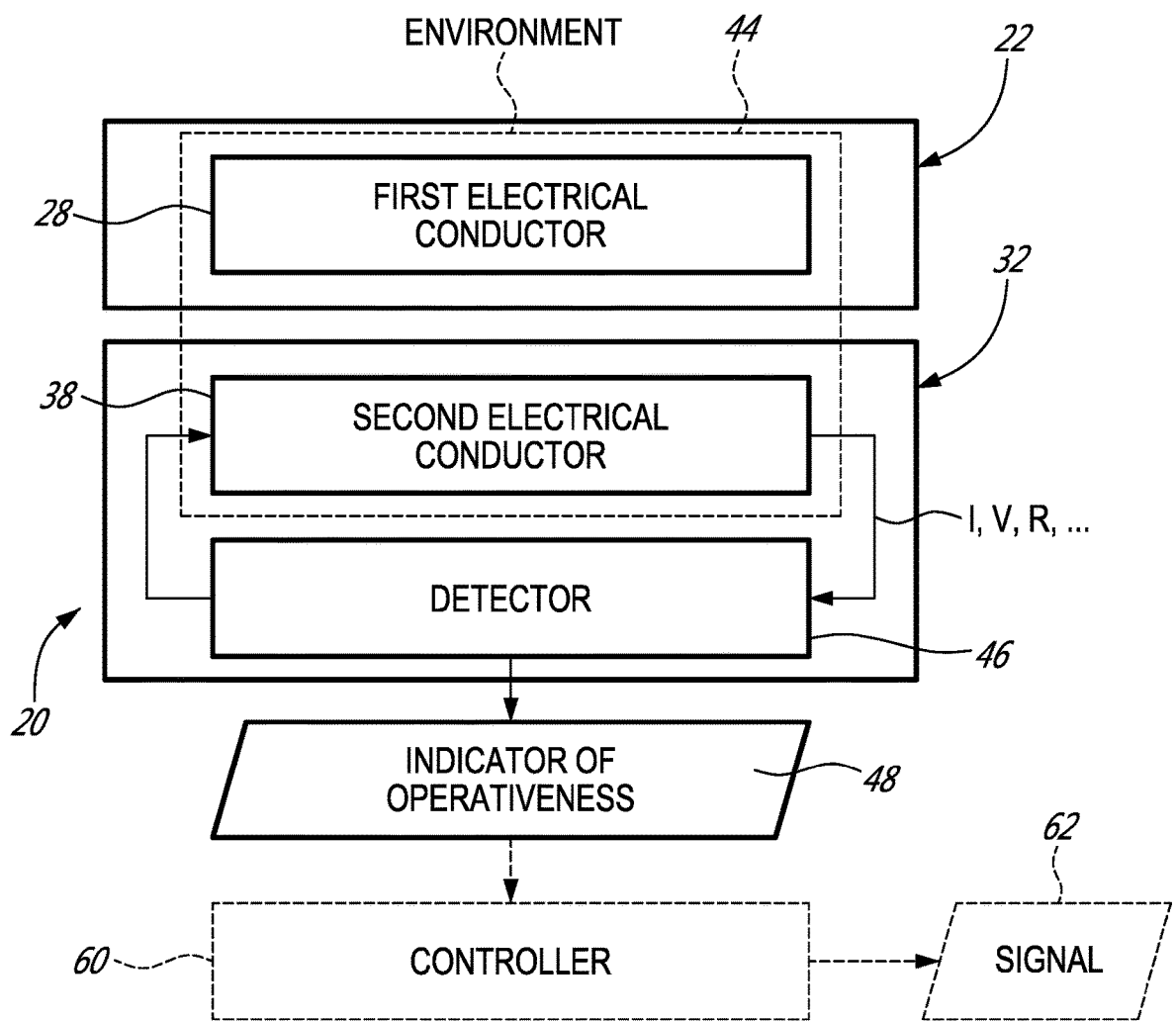
FIG. 4 is a block diagram of the aircraft engine printed circuit board assembly of FIG. 1, shown with the functional circuit of FIG. 2, the monitoring circuit of FIG. 3 and an optional controller.

FIG. 4 shows a block diagram of the aircraft engine PCB assembly 20. As shown, both the first electrical conductor 28 and the second electrical conductor 38 are exposed to the same environment 44. For instance, the first and second electrical conductors 28 and 38 can be adjacent to one another, at an equal distance to hot components of an aircraft engine, thereby be subjected to essentially the same temperature and strain variations, vibrations, etc. Accordingly, the external factors which affect age, wear, and/or fatigue over time are perceived similarly by both the first and second electrical conductors 28 and 38. However, as the second electrical conductor 38 has a shorter life expectancy, failure of the second electrical conductor 38 is expected to occur prior to the failure of the first electrical conductor 28. As such, the monitoring circuit 32 has a detector 46 monitoring an indicator of operativeness 48 (e.g. an indicator which allows to ascertain correct functionality, or otherwise said, to detect malfunction) of the second electrical conductor 38. For instance, an signal, such as a maintenance word, can be triggered if a measured value unsatisfactorily compares to a given threshold associated to correct operation.

In one example embodiment, the detector 46 can have an ammeter measuring a current I circulating across the second electrical conductor 38. In these embodiments, the given threshold can be provided in the form of a given current threshold $I_{thres}$. Accordingly, if the failure of the second electrical conductor 38 is impending, the monitored current I can drop below the given current threshold $I_{thres}$. Such a detection can be indicative that the first electrical conductor 28 has weakened and that maintenance should be performed to avoid this.

In another example embodiment, the detector 46 can have a voltmeter measuring a voltage V applied across the second electrical conductor 38. In such an embodiment, the given threshold can be provided in the form of a given voltage threshold $V_{thres}$. As such, when the monitored voltage V drops below the given voltage threshold $V_{thres}$, the failure of the second electrical conductor 38 can be impending.

In some embodiments, the detector 46 has an ohmmeter measuring a resistance R across the second electrical conductor 38. In these embodiments, the given threshold can be provided in the form of a given resistance threshold $R_{thres}$. As the monitored resistance R exceeds the given resistance threshold $R_{thres}$, as charges are prevented from freely propagating across the second electrical conductor 38, it can be assumed that the failure of the second electrical conductor 38 is impending.

In most embodiments, the detector 46 will circulate a current across the electrical conductor, and monitor a response of the electrical conductor to the circulated current.

It is intended that the detector 46 can include one or more ammeters, one or more voltmeters, one or more voltmeters, capacitance meters, or a combination thereof. Other detectors monitoring other electrical properties can be used as well. In such embodiments, more than one type of indicator of impending failure can be monitored simultaneously or sequentially, and compared to corresponding given thresholds, if found appropriate in light of the specific application.

The indicator of impending failure 48 can be measured once in some embodiments. In other embodiments, the indicator of impending failure 48 is monitored at a given frequency, e.g., once every 1 ms, once every 10 ms and the like. In some other embodiments, the indicator of impending failure 48 is measured in a continuous manner the life of the functional circuit 22.

In some embodiments, the second electrical conductor(s) 38 are monitored for continuity with continuity test excitation, which can be of a low level on par with the lower level traffic occurring on the functional circuit 22. The detector 46 is configured to capture an "open" circuit across the second electrical conductor(s) 38 of short durations.

Figure 5:
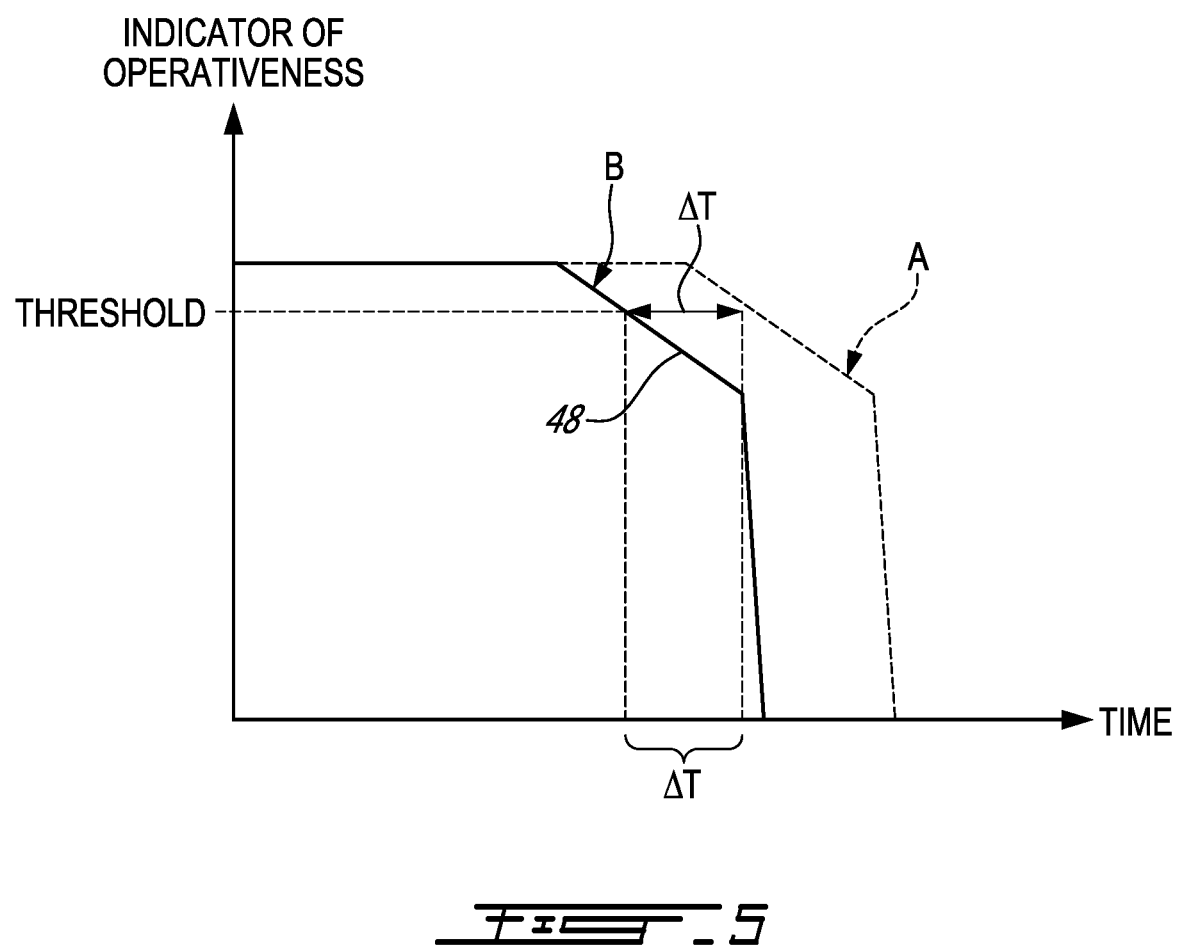
FIG. 5 is a graph of an indicator of operativeness as a function of time, with a curve representing a theoretical indicator of operativeness for the first electrical conductor and a curve representing a monitored indicator of operativeness for the second electrical conductor.

FIG. 5 shows an example of the indicator of operativeness 48 as a function of time. As illustrated, dashed curve A represents a theoretical indicator of operativeness for the first electrical conductor of the functional circuit. This indicator is theoretical as it not in fact monitored by the monitoring circuit, as the first electrical conductor can be electrically independent from the monitoring circuit, it is only expected to vary in this manner. Curve A is thus shown for explanatory purposes only.

As shown, the theoretical indicator of operativeness (e.g. an indicator which can detect malfunction or impending failure) of the first electrical conductor evolves in a satisfactory manner, until the first electrical conductor wears and/or fatigues over time, which will cause the theoretical indicator of operativeness to decrease below a given threshold, after which it can drop drastically. In contrast, solid curve B represents an indicator of operativeness of the second electrical conductor as monitored by the monitoring circuit. As can be appreciated, curve B mimics curve A, the former is only happening sooner in time as the second electrical component has a shorter life expectancy than that of the first electrical component. Accordingly, curve B shows that the indicator of operativeness of the second electrical component remains above the given threshold for a given period of time, after which the indicator gradually decreases below the given threshold, to finally drop way below the given threshold. As can be appreciated, as soon as curve B drops below the given threshold, it is expected that the indicator of operativeness of the first electrical conductor is still above the given threshold for the reasons detailed above. Accordingly, during a given period of time ΔT, defined as the period of time between the moment at which the monitored indicator of operativeness reaches the given threshold and the moment at which the theoretical indicator of operativeness reaches the given threshold, maintenance of the functional circuit can be performed prior to its theoretical failure.

Referring back to FIGS. 2 and 3, it is intended that the first substrate portion 24 and the second substrate portion 34 can be part of a single substrate in some embodiments. In these embodiments, the second electrical conductor(s) 38 may be located at areas which experience a greater stress than the first electrical conductor(s) 28. For instance, the second electrical conductor(s) 38 may be located near flexing points under vibration, near straining points where the single substrate fights its physical mount to the aircraft engine housing, or near to a stiff or heavy device (e.g., a transformer). In these situations, the monitoring of the indicator of operativeness of the second electrical conductor(s) 38 may be wired to test from the highest to the lower point within the single substrate. The greater the number of monitored second electrical conductors 38, the greater the probability of detecting a failure in one of the second electrical conductors 38.

In some embodiments, the first substrate portion 24 and the second substrate portion 34 can be part of different boards, while still being exposed to the same environment conditions throughout their useful life. The first and second substrate portions 24 and 34 can be spaced-apart from one another. The first and second substrate portions 24 and 34 can also be stacked above or otherwise superposed to each other in any suitable way. In some embodiments, the first and second substrate portions 24 and 34 can have a similar construction including similar materials and dimensions, for instance.

As shown, the second electrical conductor 38 is provided in the form of a via 38a extending across the second substrate portion 34. The via 38a can be a through via, a buried via or a blind via, depending on the embodiment.

In some embodiments, the second electrical conductor 38 is provided in the form of a conductive trace 38b running along the second substrate portion 34. The conductive trace 38b can have one or more segments running on a surface 40 of the second substrate portion 34 or extending within the second substrate portion 34.

In some embodiments, the second electrical conductor 38 is provided in the form of a solder joint 38c electrically joining a leg 42 of the second electrical component 36 to a corresponding via 38a or conductive trace 38b of the monitoring circuit 32.

In any case, the second electrical conductor 38 of the monitoring circuit 32 mimics the first electrical conductor 28 of the functional circuit 22, and has a shorter life expectancy than a life expectancy of the mimicked first electrical conductor 28.

For instance, in embodiments where the first electrical conductor 28 is a functional via 28a, the second electrical conductor 38 is a via 38a weaker than the functional via 28a. In this case, the via 38a can be made weaker than the via 28a per design, by being smaller, shorter and the like. However, in some other embodiments, the via 38a can be identical in construction to the via 28a. In these embodiments, the via 38a is made weaker by undergoing a given number of thermal cycles which will age the via 38a deliberately compared to the via 28a.

In embodiments where the first electrical conductor 28 is a functional conductive trace 28b, the second electrical conductor 38 is a conductive trace 38b weaker than the functional conductive trace 28b. In these embodiments, the conductive trace 38b can be made weaker by undergoing a given number of thermal cycles which will age the conductive trace 38b deliberately compared to the conductive trace 28b.

In embodiments where the first electrical conductor 28 is a functional solder joint 28c, the second electrical conductor 38 is a solder joint 38c weaker than the functional solder joint 28c. In some embodiments, the solder joint 38c can be made weaker by undergoing a given number of thermal cycles which will age the solder joint 38c deliberately compared to the solder joint 28c. In some other embodiments, the first and second electrical conductors 28,38 are solder joints 28c,38c of similar strength, however the second electronic component 36 is made to expand and contract more than the first electronic component 26, thereby shortening the life expectancy of the solder joint 38c relative to the life expectancy of the solder joint 28c due to the increased stress that the former will experience as a result of temperature and/or strain variations. To do so, the second electronic component 36 can have a higher coefficient of thermal expansion (CTE) than a coefficient of thermal expansion of the first electronic component 26 in some embodiments. Additionally or alternatively, the second electronic component 36 can have a larger area or size than an area or size of the first electronic component 26, thereby causing more stress on the solder joint 38c even if the coefficients of thermal expansion of the first and second electronic components 26,36 are similar. In some embodiments, the solder joint 38c is both weaker than the solder joint 28c in addition to being exposed to more expansion and contraction resulting from the second electronic component 36 having a larger coefficient of thermal expansion than a coefficient of thermal expansion of the first electronic component 26. It is envisaged that the second electronic component 36 can be a dummy component in some embodiments or an optional component in some other embodiments, to reduce the cost of the resulting monitoring circuit 32.

In the illustrated examples, the functional circuit has the two vias 28a, the two conductive traces 28b and the two solder joints 28c. However, the number of first electrical conductors 28 can differ from one embodiment to another. Similarly, the monitoring circuit 32 can have one or more vias 38a, one or more conductive traces 38b, and/or one or more solder joints 38c. The number of second electrical conductors 38 of the monitoring circuit 32 can differ from the number of corresponding first electrical conductors 28. For example, if the functional circuit 22 has a single via, the monitoring circuit 32 can have one or more vias, depending on the embodiment. In some embodiments, the monitoring circuit 32 can have a number of the second electrical conductors 38 connected in series and/or in parallel. In these embodiments, the greater the number of second electrical conductors 38, the greater the probability that one of them mimics the aging behaviour of the corresponding first electrical component 28. In this case, the detector 46 may include one or more detection units monitoring one or more indicators of operativeness of the second electrical conductors 38, either collectively or individually.

Although the monitoring circuit 32 is shown with the vias 38a, the conductive traces 38b and the solder joints 38c, other exemplary monitoring circuits can differ. For instance, the conductive traces 38b can be omitted whereby the legs 42 of the second electronic component 36 are electrically joined to the vias 38a directly via the solder joints 38c. In some embodiments, the solder joints 38c can be omitted whereby the legs 42 of the second electronic component 36 are permanently or removably received within the vias 38a. In some other embodiments, the vias 38a can also be omitted, leaving solder joints 38c electrically joining the legs 42 of the second electronic component 36 to the conductive traces 38b. Other configuration can also be envisaged.

Figure 6:
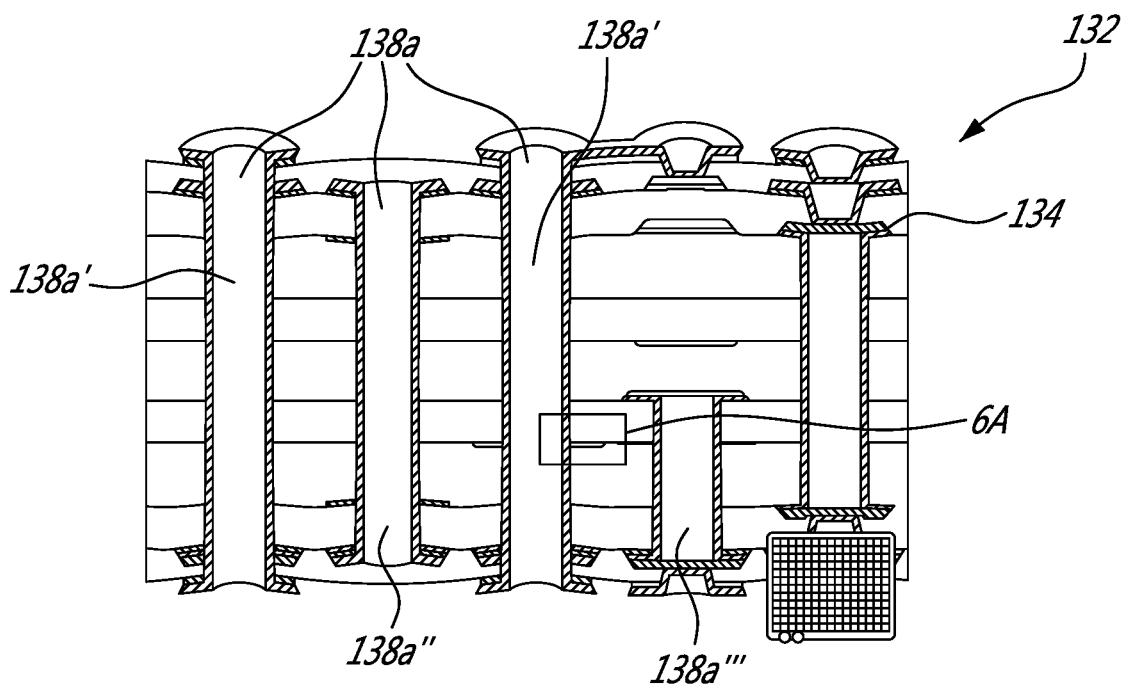
FIG. 6 is a schematic cross-sectional view of an example of a monitoring circuit having vias as second electrical conductors.

FIG. 6 shows a portion of an example of a monitoring circuit 132 having a second substrate portion 134, and vias 138a as second electrical conductors. As shown in this example, the second substrate portion 134 is provided in the form of a portion of a printed wiring board (PWB) having electrically insulating layers being interconnected to one another via second electrical conductors including, but not limited to, the vias 138a, conductive traces, conductive layers and the like. Some of the vias 138a are through vias 138a', some of the vias 138a are buried such as buried via 138a'' whereas some of the vias 138a are blind vias 138a'''. As a result of temperature and/or strain variation, the second substrate portion 134 and the vias 138a can expand and contract. However, if there is a difference in coefficient of thermal expansion between these elements, e.g., along the in-plane x- and y-axes and/or the across-plane z-axis, the vias 138a may expand or contract more than the second substrate portion 134 within which they are supported, which can induce fatigue and/or wear of the vias 138a over time.

Figure 6A:
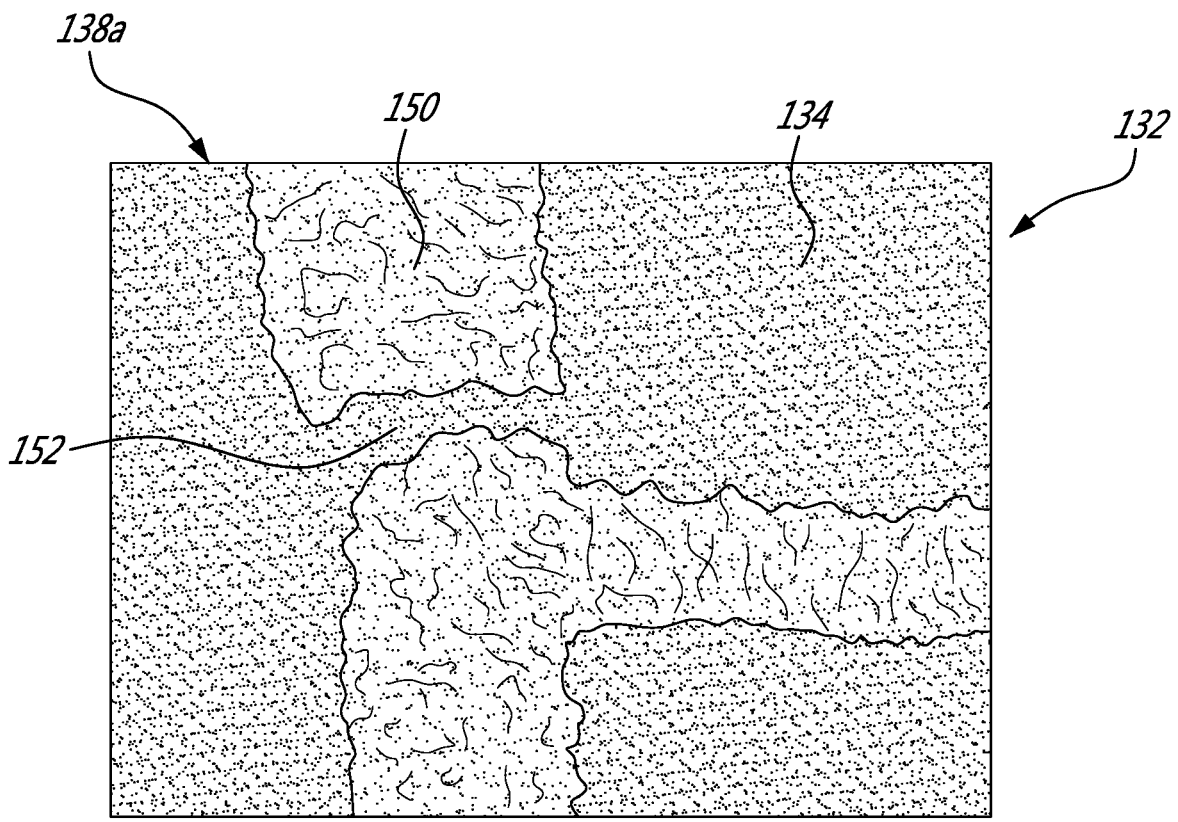
FIG. 6A is an enlarged view of inset 6A of FIG. 6, showing an example via failure.

FIG. 6A shows an enlarged portion of inset 6A of FIG. 6. As shown, the via 138a has a wall 150 which has a failure 152 that appeared over time due to successive and repeated expansion and contraction. The failure 152 shown in this example is a through crack. However, in some other embodiments, partial crack(s) can be monitored as well. By monitoring the current, the voltage and/or the resistance across the via 138a, any malfunction of a first electrical conductor that is mimicked by the via 138a can be detected prior to its actual failure as the via 138a of the monitoring circuit 132 has per design a shorter life expectancy than the corresponding via of the functional circuit. In this case, the wall 150 is totally fractured, which can be detected by the monitoring circuit 132. However, in some other embodiments, partial fractures can be detected as well.

Figure 7:
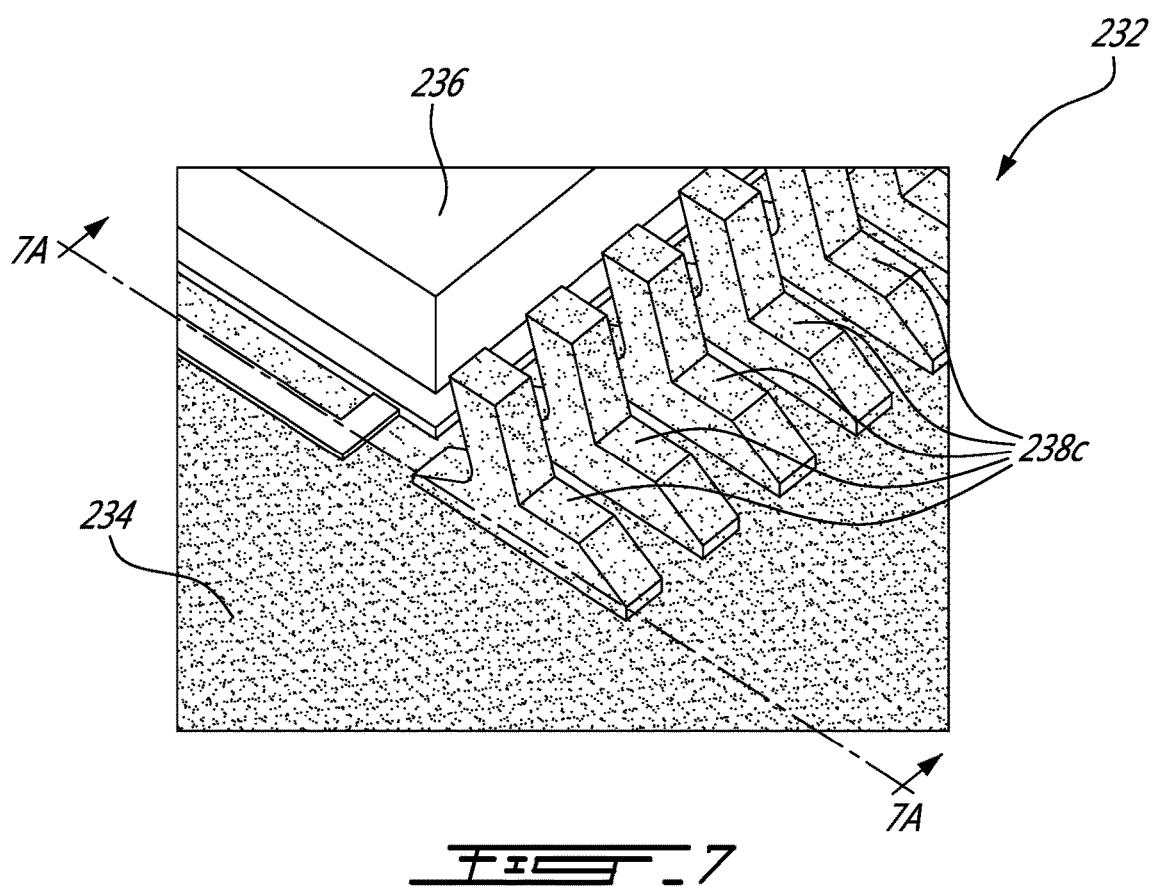
FIG. 7 is an oblique view of an example of a monitoring circuit having solder joints as second electrical conductors.

FIG. 7 shows a portion of an example of a monitoring circuit 232 having a second substrate portion 234, and solder joints 238c as second electrical conductors. As a result of temperature and/or strain variation, the second substrate portion 234, the second electrical component 236 and the solder joints 238c can expand and contract, as expected. Should there be any difference in coefficient of thermal expansion between these elements, the solder joints 238c may be subjected to more or less tension or compression, thereby increasing the wear and/or fatigue they experience and consequently reducing their life expectancy.

Figure 7A:
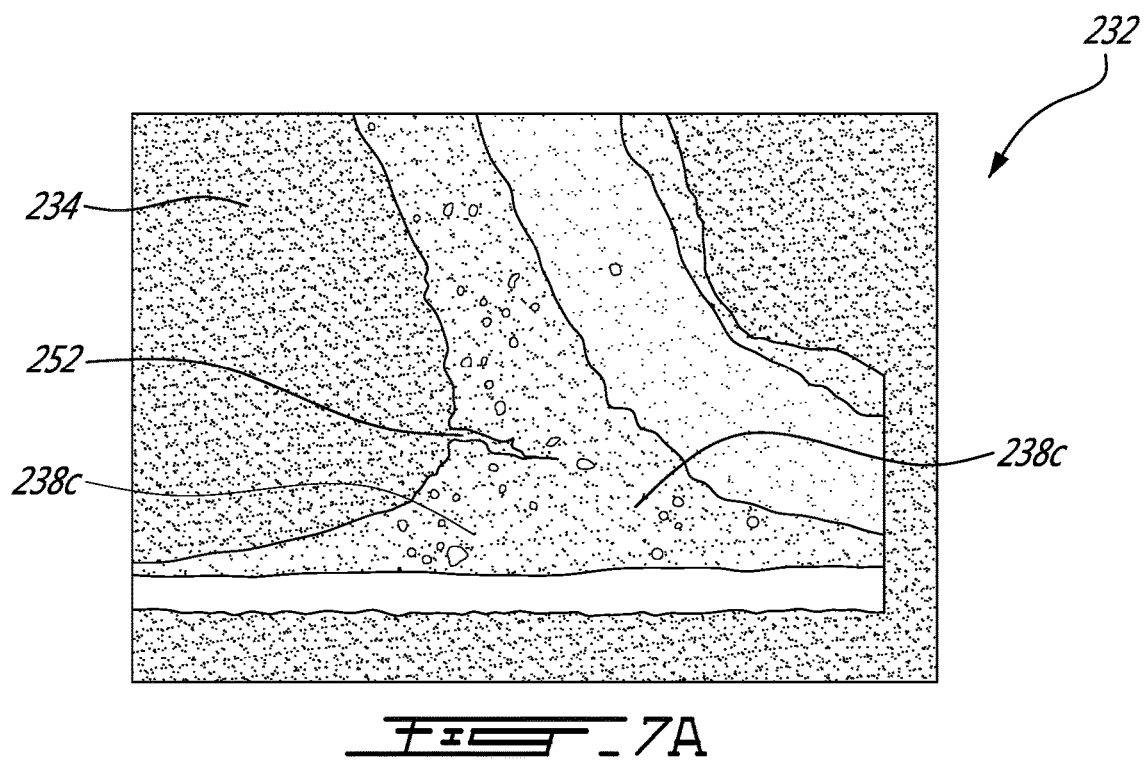
FIG. 7A is a cross-sectional view of one of the solder joints of FIG. 7, taken along section 7A-7A of FIG. 7.

FIG. 7A shows a cross-sectional view taken along line 7A-7A of FIG. 7. As depicted in this figure, one of the solder joints 238c has a partial failure 252 due to successive and repeated expansion and contraction of the surrounding elements. By monitoring the current, the voltage and/or the resistance across the solder joint 238c, any malfunction of a first electrical conductor that is mimicked by the solder joint 238c can be detected prior to its actual failure as the solder joint 238c of the monitoring circuit 232 has a shorter life expectancy than the corresponding solder joint of the functional circuit.

Referring back to FIG. 4, the aircraft engine PCB assembly 20 has a controller 60 which is communicatively coupled at least to the detector 46, in some embodiments. In these embodiments, the controller 60 is configured for receiving the monitored indicator of operativeness 48, processing the received indicator 48 and generating a signal 62. The controller 60 can be omitted in some embodiments.

In some embodiments, the controller 60 flags the functional circuit 22 as requiring maintenance based on the generated signal 62. For instance, this flagging step can be performed upon comparing the monitored indicator of operativeness 48 to a given threshold which may be stored on a memory of the controller 60.

In some embodiments, the controller 60 stores the monitored indicator of operativeness 48 on an internal and/or external non-transitory computer-readable memory via wired and/or wireless communication.

It is intended that the controller 60 can generate a maintenance request based on a comparison between the monitored indicator of operativeness and a corresponding threshold. The controller 60 can also generate a failure risk status based on the monitored indicator of operativeness. For instance, the failure risk status can be binary thereby indicating that the second electrical conductor is either working or broken. Other statuses can also be envisaged. For instance, the failure risk status can include a failure risk score which can range between "0" and "100," whereby a perfect failure risk score indicates that the second electrical conductor is completely broken, and a null failure risk score indicates that the second electrical conductor is working satisfactorily, with any score in-between indicating where the second electrical conductor is in its life.

The controller 60 can issue a warning indicating that the indicator of operativeness has reached a given value. The way the indicator of operativeness varies over time can depend from one embodiment to another. For instance, a gradual decrease (or increase) in a measured value of an indicator of operativeness may indicate the gradual degradation of the second electrical conductor (e.g., due to normal wear and tear) whereas a sudden drop (or increase) in the indicator of operativeness may indicate a sudden undesirable event, or failure. In this specific embodiment, the warning can be indicate of whether the indicator varies gradually or suddenly, and associate a level of risk to the warning. The monitored indicator of malfunction and/or the warning(s) may be issued to a computer-readably memory for storing thereof. In this case, the monitored indicator of operativeness and/or the warning(s) may be accessed during maintenance of the corresponding aircraft engine. In some embodiments, the monitored indicator of operativeness and/or the warning(s) are continuously stored on a computer-readable memory or transmitted to an external server/computer for engine health monitoring, treading and analysis.

The controller 60 can be provided as a combination of hardware and software components. The hardware components can be implemented in the form of a computing device 800, an example of which is described with reference to FIG. 8. Moreover, the software components of the controller can be implemented in the form of one or more software applications.

Referring to FIG. 8, the computing device 800 can have a processor 802, a memory 804, and I/O interface 806. Instructions 808 for monitoring a functional circuit of an aircraft engine, including but not limited to, instructions for processing any monitored indicator of operativeness, can be stored on the memory 804 and be accessible by the processor 802.

The processor 802 can be, for example, a general-purpose microprocessor or microcontroller, a digital signal processing (DSP) processor, an integrated circuit, a field programmable gate array (FPGA), a reconfigurable processor, a programmable read-only memory (PROM), or any combination thereof.

The memory 804 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like.

Each I/O interface 806 enables the computing device 800 to interconnect with one or more input devices, such as the detector(s), threshold database(s) and the like, or with one or more output devices such as display(s), memory(ies), database(s), network(s) and the like.

Each I/O interface 806 enables the controller 60 to communicate with other components, to exchange data with other components, to access and connect to network resources, to serve applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. W-Fi, WiMAX), SS7 signaling network, fixed line, local area network, wide area network, and others, including any combination of these.

In some embodiments, the software application which performs the monitoring is stored on the memory 804 and accessible by the processor 802 of the computing device 800. The computing device 800 and the software application described herein are meant to be examples only. Other suitable embodiments of the controller 60 can also be provided, as it will be apparent to the skilled reader.

FIG. 9 shows a flow chart of a method of monitoring a functional circuit contributing to the operation of an aircraft engine.

At step 902, the functional circuit is provided with a first electrical conductor.

At step 904, a monitoring circuit is made electrically independent from the functional circuit.

At step 906, the life expectancy of a second electrical conductor of the monitoring circuit is artificially reduced compared to the life expectancy of the first electrical conductor of the functional circuit.

For instance, the first and second electrical conductors can be identical in construction at first, with the second electrical conductor being subjected to temperature and/or strain variations for a given number of time, thereby reducing its life expectancy. The second electrical conductor may be aged by applying pressure or solder cycles with a numerically controller tool such as a solder pencil, for instance. In such embodiments, the solder pencil can exploit its shielding gas jet to speed cooling of the second electrical conductor between cycles, thereby enhancing the aging process. The number of thermal cycles to which the second electrical conductor is subjected can vary from one embodiment to another. Additionally or alternatively, the second electrical conductor can have a shorter life expectancy than that of the first electrical conductor per design, e.g., by reducing the dimensions (e.g., thickness, length, width) of the second electrical conductor.

At step 908, both the first and second electrical conductors are exposed to the same environment, thereby forcing the first and second electrical conductors to age together in a similar manner.

At step 910, an indicator of operativeness of the second electrical conductor is monitored.

At step 912, a signal indicative of the monitored indicator of operativeness is generated. The signal can be transmitted to and received by a controller which may initiate one or more monitoring algorithms upon processing the received signal similar to those described above.

The embodiments described in this document provide non-limiting examples of possible implementations of the present technology. Upon review of the present disclosure, a person of ordinary skill in the art will recognize that changes may be made to the embodiments described herein without departing from the scope of the present technology. For instance, the printed circuit board can be a printed wiring board. Although the examples described above are applied to the PCB assembly of an aircraft engine, it is envisaged that any aircraft system incorporating a functional circuit can be provided with a monitoring circuit such as the one described above. For instance, a cockpit system, a landing gear system, a fuel delivery system, a spoiler control system and the like. The aircraft may be any type of aircraft with an engine, such as a fixed-wing aircraft, a rotary-wing aircraft, and a jet aircraft. The engine may be any type of internal combustion engine, such as gas turbine engines, jet engines, and the like. For example, the engine may be a turbofan engine, a turboprop engine, or a turboshaft engine. Other engines may also apply. In some embodiments, the first and second substrate portions can be omitted. Yet further modifications could be implemented by a person of ordinary skill in the art in view of the present disclosure, which modifications would be within the scope of the present technology.

The invention claimed is:

1. An aircraft engine printed circuit board assembly comprising:
   a functional circuit contributing to the operation of an aircraft engine, the functional circuit having a first substrate portion, a first electronic component supported by the first substrate portion, and a first electrical conductor supported by the first substrate portion and leading to the first electronic component; and
   a monitoring circuit having a second substrate portion, a second electronic component supported by the second substrate portion, a second electrical conductor supported by the second substrate portion and leading to the second electronic component, the second electrical conductor having a shorter life expectancy than the first electrical conductor, and a detector monitoring an indicator of operativeness of the second electrical conductor;
   wherein the first electrical conductor and the second electrical conductor are both exposed to a same environment.

2. The aircraft engine printed circuit board assembly of claim 1 wherein said first and second electrical conductors are vias extending across a corresponding one of said first and second substrate portions.

3. The aircraft engine printed circuit board assembly of claim 2 wherein said vias are one of a group comprising through vias, buried vias and blind vias.

4. The aircraft engine printed circuit board assembly of claim 1 wherein said first and second electrical conductors are solder joints electrically joining said first and second electronic components to a corresponding one of said first and second substrate portions.

5. The aircraft engine printed circuit board assembly of claim 1 wherein the first and second substrate portions are part of a single substrate.

6. The aircraft engine printed circuit board assembly of claim 1 wherein the functional circuit and the monitoring circuit are electrically independent from one another.

7. The aircraft engine printed circuit board assembly of claim 1 further comprising a controller communicatively coupled to the detector, the controller having a processor and a memory having stored thereon instructions that when executed by the processor perform the step of: receiving said monitored indicator of operativeness, processing said received indicator and generating a signal.

8. The aircraft engine printed circuit board assembly of claim 7 wherein said controller performs a step of flagging the functional circuit as requiring maintenance based on said generated signal.

9. The aircraft engine printed circuit board assembly of claim 8 wherein said step of flagging is performed upon comparing the monitored indicator of operativeness to a given threshold.

10. The aircraft engine printed circuit board assembly of claim 7 wherein said controller performs a step of storing said monitored indicator of operativeness on a non-transitory computer- readable memory.

11. The aircraft engine printed circuit board assembly of claim 1 wherein the monitoring circuit has a plurality of said second electrical conductors, the detector having one or more detection units monitoring an indicator of operativeness of the plurality of the second electrical conductors.

12. The aircraft engine printed circuit board assembly of claim 11 wherein said plurality of second electrical conductors are connected in series to one another.

13. The aircraft engine printed circuit board assembly of claim 1 wherein said detector has at least one of an ammeter, a voltage meter and an ohmmeter.

14. A method of monitoring a functional circuit contributing to the operation of an aircraft engine, the functional circuit having a first electrical conductor, the method comprising:
making a monitoring circuit electrically independent from said functional circuit, the monitoring circuit having a substrate portion, an electronic component supported by the substrate portion, and a second electrical conductor supported by the substrate portion and leading to the electrical component, the second electrical conductor having a shorter life expectancy than the first electrical conductor;
exposing the second electrical conductor to the same environment as the first electrical conductor;
monitoring an indicator of operativeness of the second electrical conductor; and
generating a signal indicative of said monitored indicator of operativeness.

15. The method of claim 14 wherein said first and second electrical conductors are identical in construction, the method further comprising, prior to said exposing, artificially aging said second electrical conductor relative to said first electrical conductor.

16. The method of claim 14 wherein said first and second electrical conductors are one of a group comprising vias and solder joints.

17. The method of claim 14 further comprising storing said monitored indicator of operativeness on a non-transitory computer-readable memory.

18. The method of claim 14 further comprising flagging the functional circuit as requiring maintenance based on the monitored indicator of operativeness.

19. The method of claim 18 wherein said flagging is performed upon comparing the monitored indicator of operativeness to a given threshold.

20. A printed circuit board assembly comprising:
a functional circuit having a first electronic component and a first electrical conductor leading to the first electronic component; and
a monitoring circuit having a substrate portion, a second electronic component supported by the substrate portion, and a second electrical conductor supported by the substrate portion and leading to the second electronic component, the second electrical conductor having a shorter life expectancy than the first electrical conductor, and a detector monitoring an indicator of operativeness of the second electrical conductor.

* * * * *